(12) United States Patent
Vromans

(10) Patent No.: US 8,457,243 B2
(45) Date of Patent: Jun. 4, 2013

(54) TRANSMITTER COMPRISING A PULSE WIDTH PULSE POSITION MODULATOR AND METHOD THEREOF

(75) Inventor: Jan S. Vromans, Maastricht (NL)

(73) Assignee: NXP B.V., Eindhoven (NL)

( * ) Notice: Subject to any disclaimer, the term of this patent is extended or adjusted under 35 U.S.C. 154(b) by 271 days.

(21) Appl. No.: 12/746,487

(22) PCT Filed: Dec. 3, 2008

(86) PCT No.: PCT/IB2008/055077
§ 371 (c)(1),
(2), (4) Date: Jun. 4, 2010

(87) PCT Pub. No.: WO2009/072071
PCT Pub. Date: Jun. 11, 2009

(65) Prior Publication Data
US 2010/0246713 A1    Sep. 30, 2010

(30) Foreign Application Priority Data
Dec. 7, 2007 (EP) .................................... 07122625

(51) Int. Cl.
*H04L 27/00* (2006.01)
(52) U.S. Cl.
USPC ........... 375/295; 375/296; 375/297; 375/238; 375/239; 332/109; 332/112; 332/106; 332/115
(58) Field of Classification Search
USPC .......... 375/295, 296, 297, 238, 239; 332/109, 332/112, 106, 115
See application file for complete search history.

(56) References Cited

U.S. PATENT DOCUMENTS 3,750,035 A * 7/1973 Crow ................................ 327/8
5,838,210 A   11/1998 Midya et al.
(Continued)

FOREIGN PATENT DOCUMENTS

WO    0158012 A2   8/2001
WO    01/67596 A1  9/2001
(Continued)

OTHER PUBLICATIONS

International Search Report and Written Opinion for Int'l. Patent Appln. No. PCT/IB2008/055077 (Mar. 25, 2009).

*Primary Examiner* — Siu Lee

(57) ABSTRACT

A baseband signal generator (102*a*) provides a polar signal (A, I p) to a processing sub-unit (704*p*). The processing sub-unit (704*p*) receives furthermore feedback signals from a down converting unit (704*c*) which feedback signals are used to determine the magnitude (B) of the amplified output signal and the actual error phase. The magnitude (A) of the polar signal and the determined magnitude (B) are applied to a comparator (710) having its output connected to the input of a predistortion unit (214, 216). The output of the predistortion unit (214, 216) is connected to the input of a pulse width modulating unit (210, 212) which comprises a mapping unit (210) outputting two constant magnitude signals. The actual error phase and the phase component of the polar signal are used to generate a corrected phase component which is applied to a further mapping unit (202) forming part of a phase modulating unit (202, 204). The output signals of this phase modulating unit (202, 204) are applied to the pulse width modulating unit (210, 212) providing finally two pulse width pulse position modulated signals. These signals are applied to the switching amplifier (110).

19 Claims, 7 Drawing Sheets

U.S. PATENT DOCUMENTS

| | | | |
|---|---|---|---|
| 5,852,630 A * | 12/1998 | Langberg et al. | 375/219 |
| 6,768,779 B1 * | 7/2004 | Nielsen | 375/297 |
| 6,794,931 B2 * | 9/2004 | Kenington | 330/10 |
| 6,950,482 B2 * | 9/2005 | Schroedinger | 375/340 |
| 7,482,865 B2 * | 1/2009 | Kost et al. | 330/10 |
| 7,792,214 B2 * | 9/2010 | Matsuura et al. | 375/297 |
| 2003/0058956 A1 * | 3/2003 | Rosnell et al. | 375/295 |
| 2004/0266366 A1 * | 12/2004 | Robinson et al. | 455/91 |
| 2005/0018787 A1 | 1/2005 | Saed | |
| 2007/0152750 A1 * | 7/2007 | Andersen et al. | 330/136 |
| 2011/0007794 A1 * | 1/2011 | Vromans | 375/238 |

FOREIGN PATENT DOCUMENTS

| | | |
|---|---|---|
| WO | 02/054581 A2 | 7/2002 |
| WO | 2005/079240 A2 | 9/2005 |
| WO | 2005/119904 A1 | 12/2005 |
| WO | 2006/000088 A2 | 1/2006 |
| WO | 2007/110831 A2 | 10/2007 |
| WO | 2008/084419 A2 | 7/2008 |

* cited by examiner

TRANSMITTER COMPRISING A PULSE WIDTH PULSE POSITION MODULATOR AND METHOD THEREOF

FIELD OF THE INVENTION

The application relates to an apparatus and method for modulating signals onto a carrier signal and a transmitter. Moreover, the application relates to a computer readable medium having a computer program stored thereon for modulating signals onto a carrier.

BACKGROUND OF THE INVENTION

In communication systems information comprising speech or other data is transmitted via a high frequency signal. For these communication systems communication signals are modulated from the baseband onto a carrier signal via phase modulation, amplitude modulation or other modulation methods within a transmitter.

In general, at first a baseband is generated comprising the information being transmitted. For increasing the transfer rate it is advantageous to use the amplitude component as well as the phase component as information carrier. After modulating the signal onto a carrier signal the signal may be amplified to a adequate transmitting power.

It is very important to reduce power consumption of the used transmitters. In particular, the used power amplifiers, like class A or B amplifiers, dissipate much energy. Thus one method to realize reduction of power consumption is to make use of power amplifiers having a high efficiency, like switching amplifiers. For instance, class D or class E amplifiers can be used.

However, for employing switching amplifiers, suitable modulation methods are necessary since the switching amplifiers make high demands on linearity of the signal being amplified. Due to these high demands it is not possible to directly amplify a modulated signal which does not comprise a constant envelope. Thus appropriate modulation methods are needed, for instance, pulse width modulation (PWM) or pulse density modulation (PDM).

For controlling a switching amplifier, several methods are known. According to one method, the input of the amplifier is driven with a two-level PWM signal, which is generated by comparing the AM- and PM-modulated carrier signal with a triangular or saw tooth signal, which fundamental frequency is at least twice the carrier frequency. This poses the problem of a high switching frequency of the power amplifier and in particular the high linearity requirements regarding the triangular signal. Moreover, the carrier signal already should have been linearly AM-modulated before PWM conversion takes place. A pulse width-pulse position (PWM-PPM) modulated signal can also be generated by applying the envelope to one input of a comparator and a phase modulated RF triangular signal to the other input of the comparator.

Another possibility for driving a switching amplifier is to use a two-level PWM signal as the amplifier input signal, the PWM signal being generated by a band pass sigma-delta converter. The main disadvantage coming along with this solution is the even higher PA switching frequency, i.e. a significant over-sampling ratio.

According to another class of solutions for controlling a switching power amplifier the amplitude component is added via modulation of the supply voltage of the switching power amplifier. This modulation can be done via an efficient DC-DC converter. However, it is difficult to achieve a high modulation bandwidth and to suppress unwanted noise or ripple generated by the DC-DC converter at the same time.

It is one object of the present application to provide reduced power consumption of the apparatus. It is yet another object of the invention to improve the overall linearity of the apparatus.

SUMMARY OF THE INVENTION

These and other objects are solved by the apparatus according to the invention. The apparatus comprises a signal generator configured to generate a signal. The apparatus further encompasses a pulse width modulating unit configured to modulate the signal. The apparatus includes an amplifier unit configured to amplify the signal. The apparatus comprises a feedback loop path configured to correct the signal using an error signal, wherein the feedback loop path comprises a converting and processing unit configured for down converting the amplified signal and correcting the generated signal using the error signal.

The apparatus may be implemented within a transmitting device for transmitting any kind of information, like data, speech or the like. Furthermore, the apparatus can be implemented at least partially within a digital domain as well as within an analogue domain.

As mentioned above the apparatus encompasses a signal generator. The signal generator may create a signal depending on the information being transmitted. The signal may be a base band signal. The information being transmitted may be contained at least within the amplitude component of the generated signal.

The generated signal is then corrected in a converting and processing unit as explained below and subsequently modulated onto a carrier signal by means of the pulse width modulating unit. The advantage of a pulse width modulated signal is that the modulated signal comprises an almost constant envelope. The modulated carrier signal is then amplified by means of the amplifier unit. A non-linear behavior of the switches normally results in distortion of the modulated signal. To improve the linearity of the apparatus and the transmitter, which the apparatus according to the invention may be installed in, the apparatus comprises a feedback loop path, in which an error signal is generated depending on the discrepancy between the wanted and the actual signal outputted by the amplifier.

According to the invention the feedback loop path comprises a converting and processing unit configured for down converting the amplified signal and correcting the generated signal using the error signal. Thus, the feedback loop path ensures a high degree of linearity of the apparatus despite the fact that a switching Power amplifier, which may be used in the apparatus due to their high efficiency, operates in a strongly non-linear region.

According to one embodiment, the created signal may be a polar signal. A polar signal comprises generally an amplitude component and a phase component. The transfer rate can be increased due to the fact that both the amplitude component and the phase component can be used as information carriers. The polar signal can be split into an amplitude component and a phase component. The amplitude component is in accordance with the envelope of the polar signal. It is found that merely the amplitude component of the polar signal can be forwarded to the pulse width modulating unit. The use of the high frequency component of the amplitude may be advantageous. The dynamic range can be improved.

According to a further embodiment, the amplifying unit can be implemented as a switching power-amplifying unit within the apparatus for reducing power consumption.

A switching amplifying unit may encompass at least one input for the signal being amplified and at least one input for voltage supply. Such a switching unit can be employed in combination with suitable modulation methods, like pulse width modulation (PWM). The switching power amplifier may be a class D or class E amplifier. These types of power amplifiers are especially suitable due to their small power consumption. However, similar amplifying devices can also be implemented into the apparatus according to the application. The present apparatus according to embodiments may provide a significant power consumption reduction.

According to a further embodiment of the invention the apparatus may comprise a predistortion unit configured to predistort the generated signal. The predistortion unit predistorts the generated signal. In particular, the amplitude component or the envelope can be predistorted. It is found, according to the present invention that the predistortion unit may predict non-linear behavior of following employed units. It is further found that the predistortion unit may be used to obtain at least one signal comprising an almost constant envelope. According to the invention the feedback loop path comprises a converting and processing unit by means of which an error signal is used to correct the signal generated by the signal generator preferably prior to predistortion.

It is found that the modulated signal should be substantially linear for applying switching amplifying units. This predistortion unit may thus be configured to determine a phase shift function depending on the generated signal, for example of the amplitude component of a polar signal. For achieving a substantially linear signal, the predistortion unit may convert and bias the amplitude component into a suitable phase shift function containing the signal information, for example the amplitude component information. Furthermore, the predistortion unit may enable in an advantageous manner to calculate a proper phase shift function for further processing, like modulating the phase shift function via pulse width modulation onto a carrier signal.

Moreover, the predistortion unit may comprise a first determining unit to determine a duty cycle function depending on the generated signal, for example, the amplitude component of a polar signal. According to the present application it is found that the desired phase shift function may depend on the duty cycle. The duty cycle depending in turn on the amplitude component may be calculated according to an implemented suitable algorithm. For example, the duty cycle can be calculated by the arcsine function applied to the amplitude and a constant multiplication factor. The found dependency of the duty cycle on the generated signal, in particular the amplitude component of a polar signal, may enable an implementation with low effort and costs.

The predistortion unit may also comprise a second determining unit for determining the desired phase shift function depending on the duty cycle function. It is found that the phase shift function depends linearly on the obtained duty cycle function additionally taking into account the maximum constant phase shift. Thus, the needed algorithm can be implemented easily.

The predistortion unit may comprise further units, like limiting units or normalization units. However, a person skilled in the art is able to implement such components if the components are needed.

According to another embodiment, the apparatus may comprise a pulse position modulating unit configured to process a phase component of the generated signal. It is found that using the phase component as information carrier increases the transfer rate. Pulse position modulating (PPM) may be a suitable modulation form. Such a pulse position unit can be implemented in an easy manner and separated from the pulse width-modulating unit.

What is more, the first pulse position modulating unit may comprise a first mapping unit configured to map the phase component of the polar signal to at least one suitable function according to a chosen implementation of the pulse position modulating unit. Suitable functions may be trigonometric functions, like sine and/or cosine functions. The input signal of the mapping unit, like the phase component, may be mapped onto at least one of the above mentioned functions. There are several options for mapping, like using a CORDIC algorithm or a ROM table. The use of such options may reduce computing expenditure. The mapping unit may be realized digitally. However, an analogue implementation may be possible as well.

Furthermore, the first pulse position modulating unit may comprise a first up converting unit. This unit may be arranged for modulating the information included in the phase component and the suitable mentioned function, respectively, onto a carrier signal. The carrier signal may be a signal comprising a cosine and/or sine function.

A signal having any suitable frequency can be used as a carrier signal. A voltage control oscillator (VCO), a voltage controlled crystal oscillators (VCXO) or the like may generate the carrier signal.

According to another embodiment of the present invention, the first pulse width modulating unit may comprise a second mapping unit configured to map the phase shift function to at least one suitable function according to a chosen implementation of the first pulse width modulating unit. This second mapping unit can be implemented similar to the first mapping unit.

Additionally, the pulse width modulating unit may also comprise a second up converting unit which can be realized similar to the first up converting unit. Advantageously, merely one carrier signal generator, like a VCO, may be used for both the pulse width modulating unit and pulse position modulating unit.

An up converting unit may comprise several calculating units to modulate the input signals, like the phase shift function and/or phase component and the corresponding function mentioned above, respectively, onto a carrier signal. For instance, the modulating unit may comprise at least one multiplying unit and/or at least one addition unit and/or at least one signum unit. A comparator can be employed as a signum unit. However, other arrangements comprising other logic and/or calculating units are possible.

The pulse width modulating unit and the pulse position-modulating unit may be implemented as one pulse width pulse position modulating (PWM-PPM) unit. This unit may comprise merely one mapping unit and one up converting unit. The phase component and the predistorted amplitude component both may be fed to the PWM-PPM unit. A realization of the PWM-PPM modulating unit can be performed with small effort and reduced costs.

The converting and processing unit according to the invention is configured for down converting the amplified signal and correcting the generated signal using the error signal. According to an advantageous embodiment of the invention the converting and processing unit may comprise a converting subunit a processing subunit, wherein the converting subunit is configured for down converting the amplified signal and the processing subunit is configured for correcting the generated signal depending on the down converted signal.

The converting subunit of the converting and processing unit may comprise at least one multiplier and/or at least one low pass filter and/or at least one delay element. For correcting the generated signal, for example a base band signal, the amplified signal is down converted onto the frequency of the generated signal. The arranged carrier signal generator for up converting can be used for down converting. An implementation can be performed easily.

Due to the fact that the signal being modulated may be split into an amplitude component and a phase component at least one of the corresponding components of the amplified signal may be detected. Thus, at least an envelope detecting unit and/or phase detecting unit may be arranged within the processing subunit of the converting and processing unit according to the invention. It may be advantageous to detect both the amplitude component and phase component of the combined signal for correcting the respective components of the polar signal. An improved result can be achieved.

Furthermore, the processing subunit of the converting and processing unit may comprise a first comparing unit and a first integrator for correcting the amplitude component and/or a second comparing unit and a second integrator for correcting the phase component. The first comparing unit, which may be implemented as a comparator, may compare the detected amplitude component of the combined signal with the amplitude component generated by the signal generator. The processing unit may as well comprise a second comparing unit. For the second comparing unit a comparator or the like may be employed to compare the detected phase component of the amplified signal with the phase component generated by the signal generator. However, several possibilities for implementation are possible.

In addition, the processing subunit according to the present invention may further comprise a first integrator unit. Advantageously, a first and a second integrator unit may be arranged within the processing subunit. The first and second integrator units can be arranged following the first and second comparing units, respectively. Further the integrator units may be used for correcting the phase component and amplitude component depending on the compared phase signal and amplitude signal, respectively. The corrected phase component may be fed to the pulse position-modulating unit, whereas the corrected amplitude component may be fed to the predistortion unit. The combination of comparing units and the integrator units may yield to a good result with low effort.

The converting subunit of the converting and processing unit may be implemented in the analogue domain, whereas the processing subunit may be implemented in the digital domain.

Another aspect of the present application is a method comprising generating a signal. The method includes modulating the signal using pulse width modulation. The method comprises amplifying the modulated signal. The method further comprises the step of down converting the amplified signal and generating an error signal to correct the generated signal.

A further aspect of the present application is a computer readable medium having a computer program stored thereon. The computer program comprises instructions operable to cause a processor to perform at least the above-mentioned method.

The present application can be deployed in several application areas which include efficient modulated transmitters. The transmitters can be used for WLAN, WPAN, Bluetooth, OFDM, GSM, UMTS, CDMA, low power mobile communication devices and the like.

It should be noted that only elements relevant to the principle of the present application are explained above. Components, like delay elements or analog digital converter are omitted. However, a person skilled in the art is able to implement such components if the components are needed.

These and other aspects of the present patent application become apparent from and will be elucidated with reference to the following figures. The features of the present application and of its exemplary embodiments as presented above are understood to be disclosed also in all possible combinations with each other.

DETAILED DESCRIPTION OF THE DRAWINGS

In the following detailed description of the present invention exemplary embodiments of the present invention will describe and point out the architecture of the apparatus according to the invention. The main advantage of the invention and thus of all embodiments is a reduced power consumption and an increased linearity of the signal being amplified.

Figure 1:
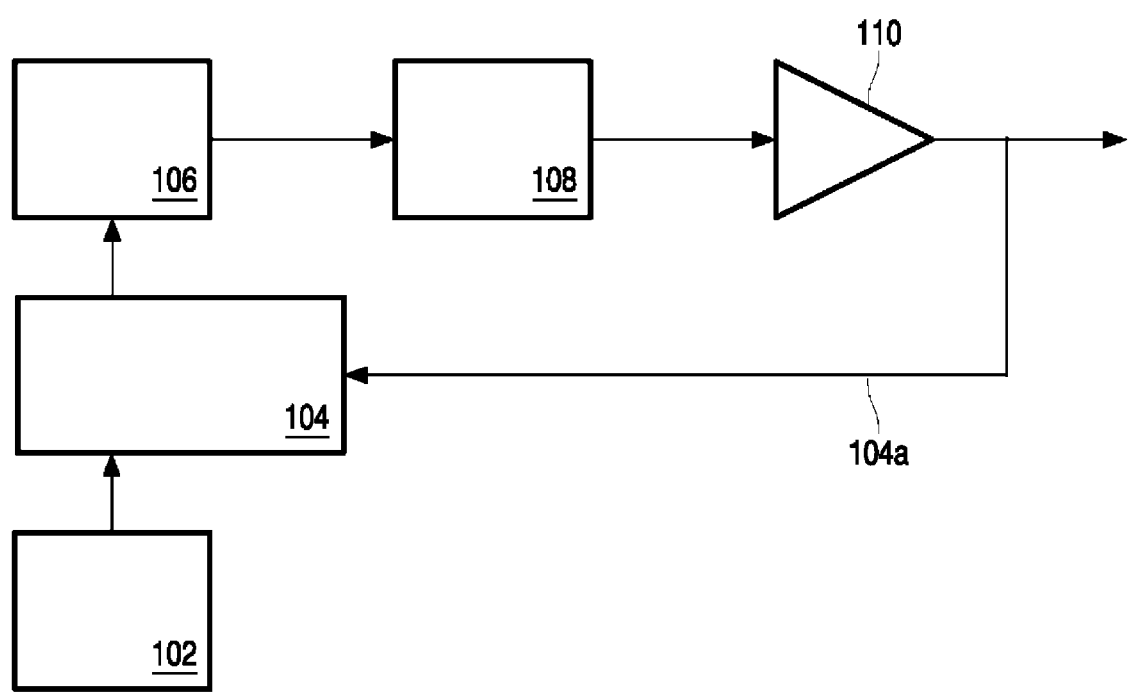
FIG. 1 a first embodiment of the apparatus according to the invention.

FIG. 1 shows an exemplary simplified embodiment of the apparatus according to the present invention. The shown apparatus can generally be implemented in an analogue way or partly within the digital and partly within the analogue domain.

According to this embodiment the apparatus comprises a signal generator 102.

Presently, the signal generator 102 is connected to a converting and processing unit 104 which corrects the generated signal using an error signal for increasing the overall linearity of the apparatus as explained below. For instance, the signal generator 102 may be a digital base band processor which generates at least one signal. The signal, for example an amplitude component including the information being transmitted of the generated signal, is forwarded to the converting and processing unit 104. The signal thus corrected is presently forwarded to a predistortion unit 106, which further improves the linearity of the system.

The predistortion unit 106 may comprise suitable components to realize the essential algorithms for predistortion. An elucidation of one embodiment of the predistortion unit 106 according to the present application occurs subsequently.

The signal created by the predistortion unit 106 is fed to a pulse width-modulating unit 108 which will be described in more detail subsequently. In general, the modulating unit 108 may modulate the incoming signal onto a carrier signal. The first pulse width-modulating unit 108 may be realized partly analogue and partly digital.

The modulated signal is then fed to an amplifier unit 110. The amplifier unit 110 may be a switching power amplifier, like class D or class E amplifiers. These types of amplifiers offer the advantage to be very efficient. However, according to other variants of the present application, employing of different amplifiers is possible.

The amplified signal may then be filtered in a filtering unit (not shown). The amplified and optionally filtered signal may then be fed to an antenna device (not shown) for transmission.

According to the invention the amplified signal, preferably the filtered amplified signal is also fed to the converting and processing unit 104 via a feedback loop path 104a configured to correct the signal using an error signal. The feedback loop path 104a ensures a high degree of linearity of the apparatus despite the fact that a switching power amplifier, which may be used in the apparatus due to its high efficiency, operates in a strongly non-linear region.

A transmitter should offer a good linearity for the case a switching power amplifier, like a class D or E amplifier, is used for reducing power consumption. Pulse width modulated signals are suitable to obtain a good linearity.

Figure 2:
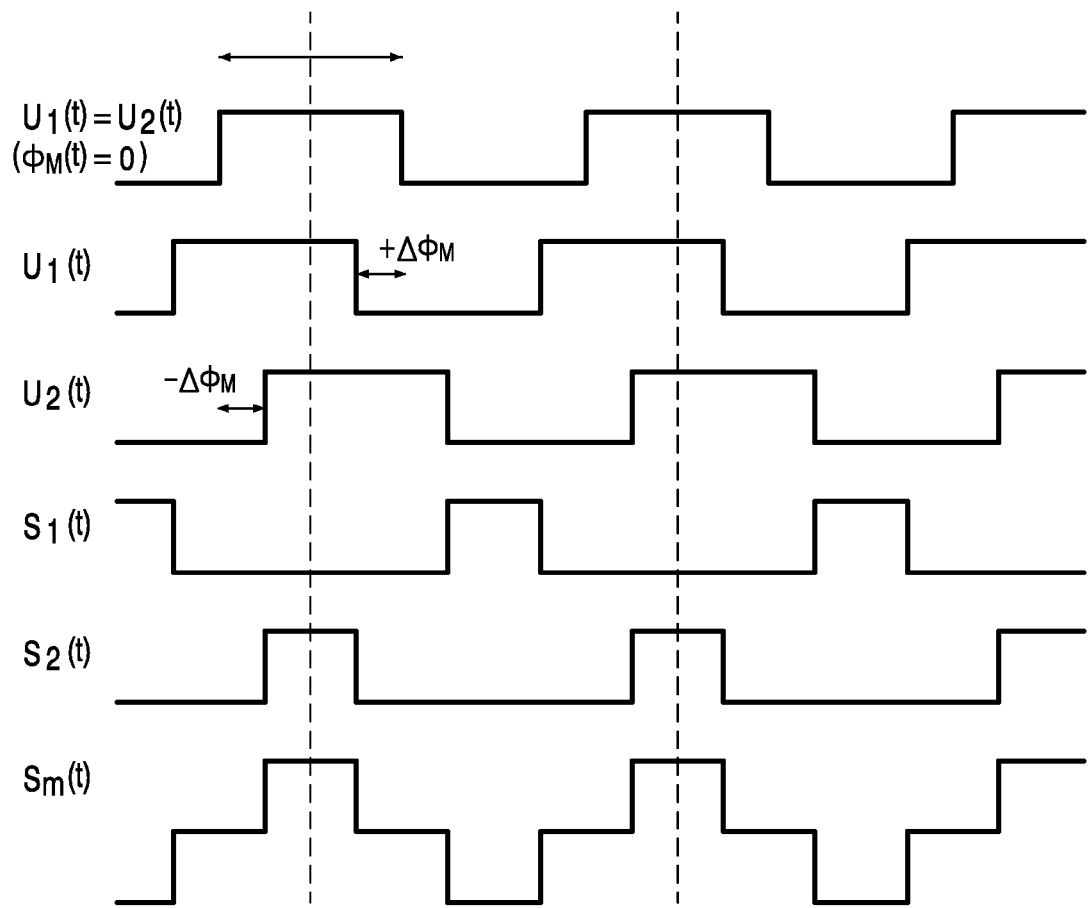
FIG. 2 a first exemplary diagram to create a pulse width modulated signal.

There are several methods to generate a pulse width modulated signal (PWM signal), like applying a saw or triangular signal. A PWM signal can be done with the help of two opposite shifted carriers. FIG. 2 shows signals $u_1(t)$ and $u_2(t)$ which are opposite phase shifted by $\Delta\Phi_M$.

The phase shift signal or function $\Phi_M(t)$ includes the information of the amplitude component A being transmitted. For simplification reasons only a constant phase shift $\Delta\Phi_M$ is shown according to FIGS. 2 and 3. It will be explained subsequently how the phase shift signal $\Phi_M(t)$ can be obtained.

The illustrated signal $s_1(t)$ can be obtained using a NOR function of the opposite phase shifted signals $u_1(t)$ and $u_2(t)$. The second signal $s_2(t)$ can be determined by an AND function of the signals $u_1(t)$ and $u_2(t)$. A detailed implementation of the apparatus will be elucidated subsequently.

Figure 3:
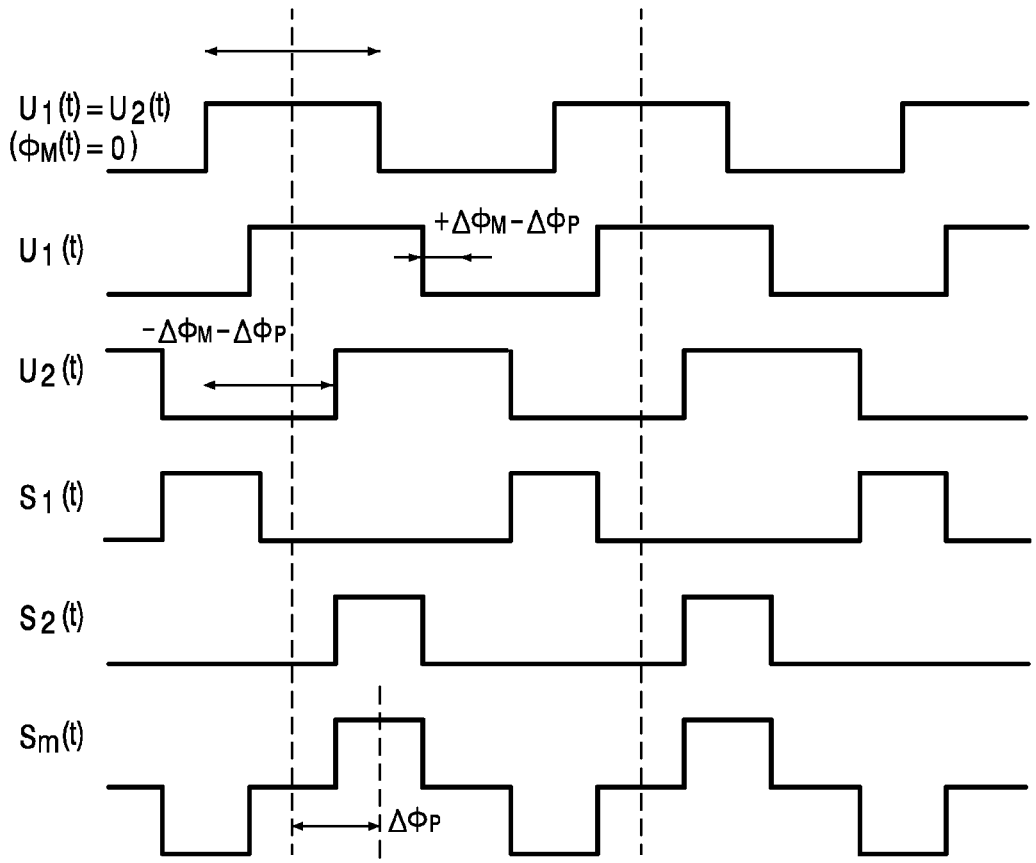
FIG. 3 a second exemplary diagram to create a pulse width modulated signal having an additional phase shift depending on the pulse position modulation.

FIG. 3 shows similar signals compared to FIG. 3. The difference between the two diagrams according to FIGS. 2 and 3 is an additional phase shift $\Delta\Phi_P$ depending on a PPM modulation of the phase component ($\Phi_P$ of the generated signal. In the following a possible predistortion for deriving the desired phase shift function $\Phi_M(t)$ to achieve an almost linear signal for driving the amplifying unit 110 is explained. By the aid of the following FIG. 4, it will be elucidated how the desired phase shift function $\Phi_M(t)$ which represents the amplitude information is determined.

Figure 4:
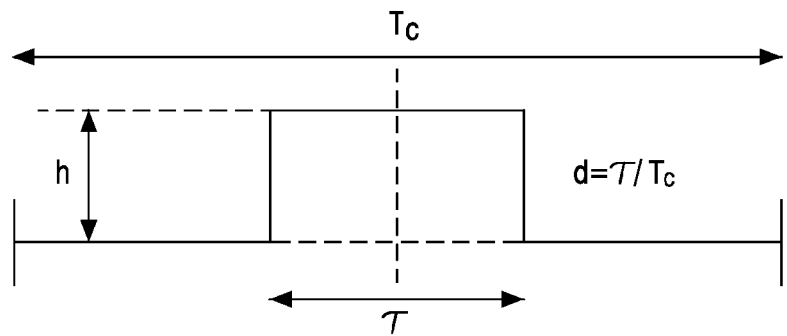
FIG. 4 an exemplary diagram of a pulse.

In FIG. 4 an exemplary diagram of a pulse is shown. The depicted pulse has a pulse length $\tau$ and a height h within a period $T_C$ corresponding to the carrier frequency $\omega_C$. Thus the duty cycle is $d=\tau/T_C$. Through Fourier series expansion the following equitation can be obtained $$f(t) = \frac{\tau h}{T_C} + \frac{2h}{\pi}\left[\sin\left(\frac{\tau}{T_C}\pi\right)\cos(\omega_C t) + \frac{1}{2}\sin\left(\frac{2\tau}{T_C}\pi\right)\cos(2\omega_C t) + \frac{1}{3}\sin\left(\frac{3\tau}{T_C}\pi\right)\cos(3\omega_C t) + ...\right]$$

Substitution of the duty cycle d and conversion of the function f(t) into a sum yield $$f(t) = dh + \frac{2h}{\pi}\sum_{n=1}^{\infty}\frac{\sin(nd\pi)}{n}\cos(n\omega_C t).$$

This function represents the relation between the amplitudes of the fundamental frequency and its harmonics depending on the duty cycle d. The amplitude $A_n$ of the $n^{th}$ harmonic of the fundamental frequency as a function of the duty cycle is then given by $$A_n = \frac{2h}{\pi}\frac{\sin(nd\pi)}{n}.$$

$A_n$ reaches its maximum value $$A_{n,max} = \frac{2h}{\pi n}$$

for a duty cycle value $$d = \frac{1}{2n}.$$

According to the present invention it has been found that for the applied PWM modulation method a continuously decreasing or increasing function $A_n$ (d) is needed.

Function $A_1$ is a continuously increasing or decreasing function. It is further found, according to the present invention that an amplitude change of the $n^{th}$ harmonic of the pulse train may occur according to the next equitation $$d = \frac{1}{n\pi}\arcsin\left(\frac{n\pi A_n}{2h}\right).$$

The duty cycle d of the first harmonic signal is achieved by substitution of n=1 and h=1

$$d = \frac{1}{\pi}\arcsin\left(\frac{\pi A_1}{2}\right).$$

An envelope signal which may be normalized in the range from 0 to 2/will result in a linear AM modulation of the first harmonic fundamental of the pulse width modulated signal. It may be suitable to normalize the amplitude $A_{norm}$ to the range from 0 to 1 and the final predistortion function is then:

$$d(t) = \frac{1}{\pi}\arcsin(A_{norm}(t)).$$

Thus a duty cycle function d(t) is obtained in the predistortion unit 106.

As may be seen from FIG. 2 the maximum phase shift is given by $$\hat{\Phi}_M = \frac{\pi}{2}.$$

The desired phase shift function $\Phi_M(t)$ can also be derived from FIG. 2.

Depending on the duty cycle d(t) and the maximum phase shift $\hat{\Phi}_M$ the searched function $\Phi_M(t)$ is given by $$\Phi_M(t)=(1-2d(t))\hat{\Phi}_M.$$

This function $\Phi_M(t)$ which comprises the amplitude information being transmitted is suitable for the applied PWM modulation.

For an additional PPM modulation predistortion and conversion is not needed due to the linear relation between the wanted phase modulation $\Phi_P(t)$ and the phase component. Thus $\Phi_P(t)$ is given by the following equitation $$\Phi_P(t)=\arg(s_{baseband}(t)).$$

Figure 5:
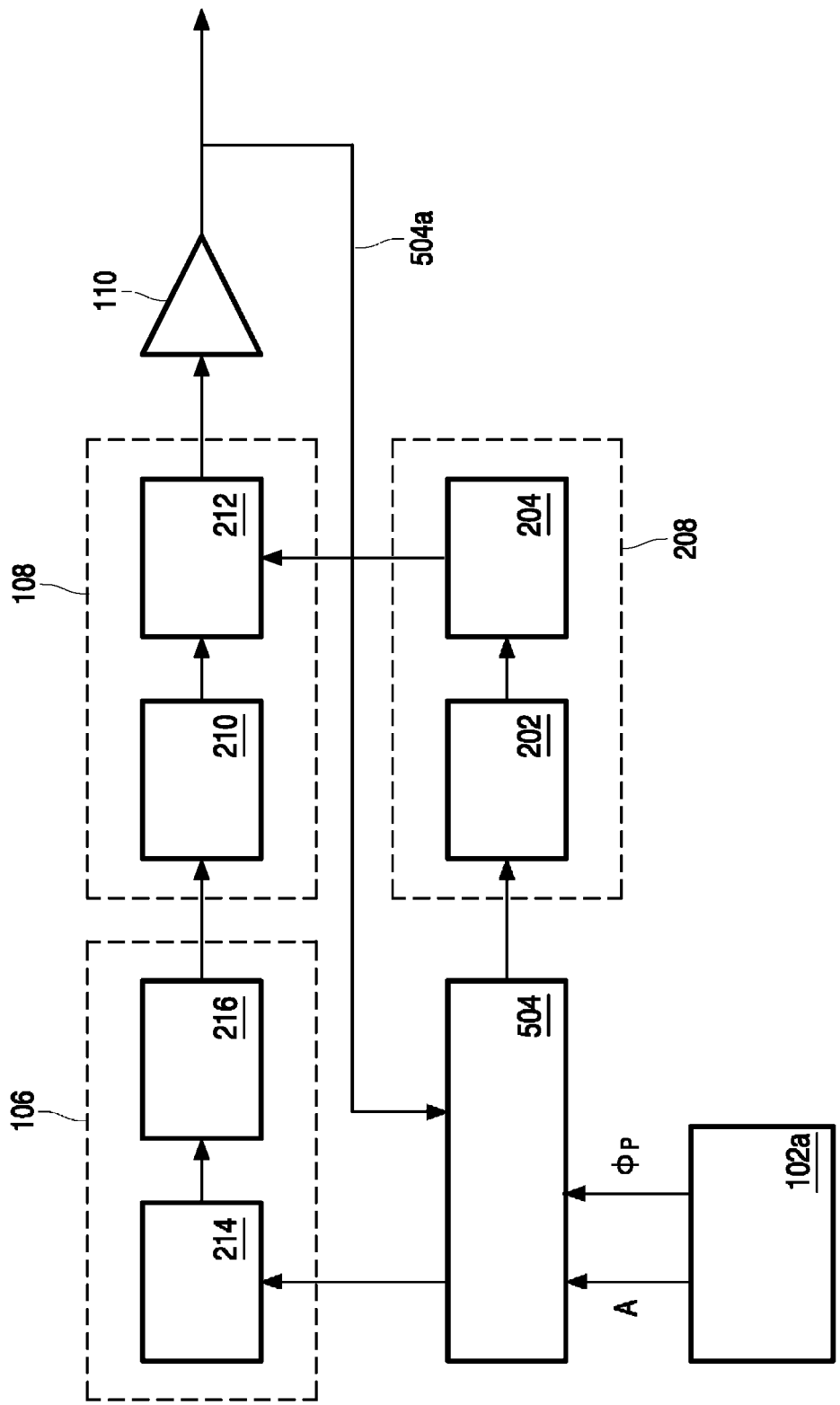
FIG. 5 a second embodiment of the apparatus according to the present invention

FIG. 5 shows a further exemplary simplified embodiment of the apparatus according to the present invention. The shown apparatus can be implemented in an analogue way or partly within the digital and partly within the analogue domain. The already known components are not explained again and hold the same reference signs.

The apparatus encompasses a signal generator 102a. The signal generator 102a depicted in this embodiment generates a base band polar signal. However, use of other signals is possible. This polar signal comprises an amplitude component A and a phase component $\Phi_P$. Both are used as information carriers according to the present embodiment.

Both the amplitude component and the phase component $\Phi_P$ are fed to a converting and processing unit 504. Again, the converting and processing unit 504 corrects the generated signal, namely the amplitude and the phase component, using an error signal for increasing the overall linearity of the apparatus.

The corrected phase component $\Phi_p$ is forwarded to a first mapping unit 202 included in the phase modulating unit 208. This mapping unit 202 may be configured to map the input variables to proper functions for following modulating operations. The CORDIC algorithm, a ROM table or other appropriate methods can be implemented for mapping to reduce calculating time.

The signal created by mapping unit 202 is forwarded to a first up converting unit 204 where pulse position modulation (PPM) is performed. The up converting unit 204 may be implemented analogue and may comprise at least one carrier signal generator, like a voltage control oscillator (VCO), a voltage controlled crystal oscillators (VCXO) or the like.

In addition, multipliers may be arranged within the up converting unit 204 for up converting. The amplitude component A is forwarded to the arranged predistortion unit 106 after correction in the converting and processing unit 504. The predistortion unit 106 comprises at least a first determining unit 214 and a second determining unit 216 according to the present embodiment.

In the first determining unit 214 the duty cycle function d may be calculated depending on the amplitude component A according to the function $$d=\frac{1}{\pi}\arcsin(A).$$

The achieved duty cycle d can be forwarded to the second determining unit 216 to calculate the desired phase shift function $\Phi_M(t)$ by the given function $$\Phi_M = (1-2d)\hat{\Phi}_M, \text{ wherein } \hat{\Phi}_M = \frac{\pi}{2}.$$

The determined phase shift function $\Phi_M(t)$ is fed to the pulse width modulating unit 108 which comprises at least a second mapping unit 210 and a second up converting unit 212.

The depicted second mapping unit 210 may operate similar to the previous mentioned first mapping unit 202. The achieved suitable functions comprising the information being transmitted are forwarded to the second up converting unit 212, where pulse width modulation (PWM) is performed. This up converting unit 212 can also be supplied by the at least one carrier signal comprising the information of the phase component $\Phi_p$. An additional carrier signal generator may be omitted, since the carrier signal generator of the first up converting unit 204 can be used. Thus, easy implementation is possible. By means of multipliers or the like, a modulated signal can be created which comprises both the amplitude and phase information.

The two arranged modulating units 108, 208 can be implemented as a common unit, like a pulse width pulse position modulating unit (PWM-PPM) according to other embodiments of the present application.

The signal outputted by up the first modulating unit 108 is fed to the amplifier unit 110. According to the invention the architecture according to FIG. 5 comprises a feedback loop path 504a configured to correct the generated signal using an error signal. Part of the feedback loop path 504a is the converting and processing unit 504.

Further processing is already known and will be elucidated in more detail subsequently.

Figure 6:
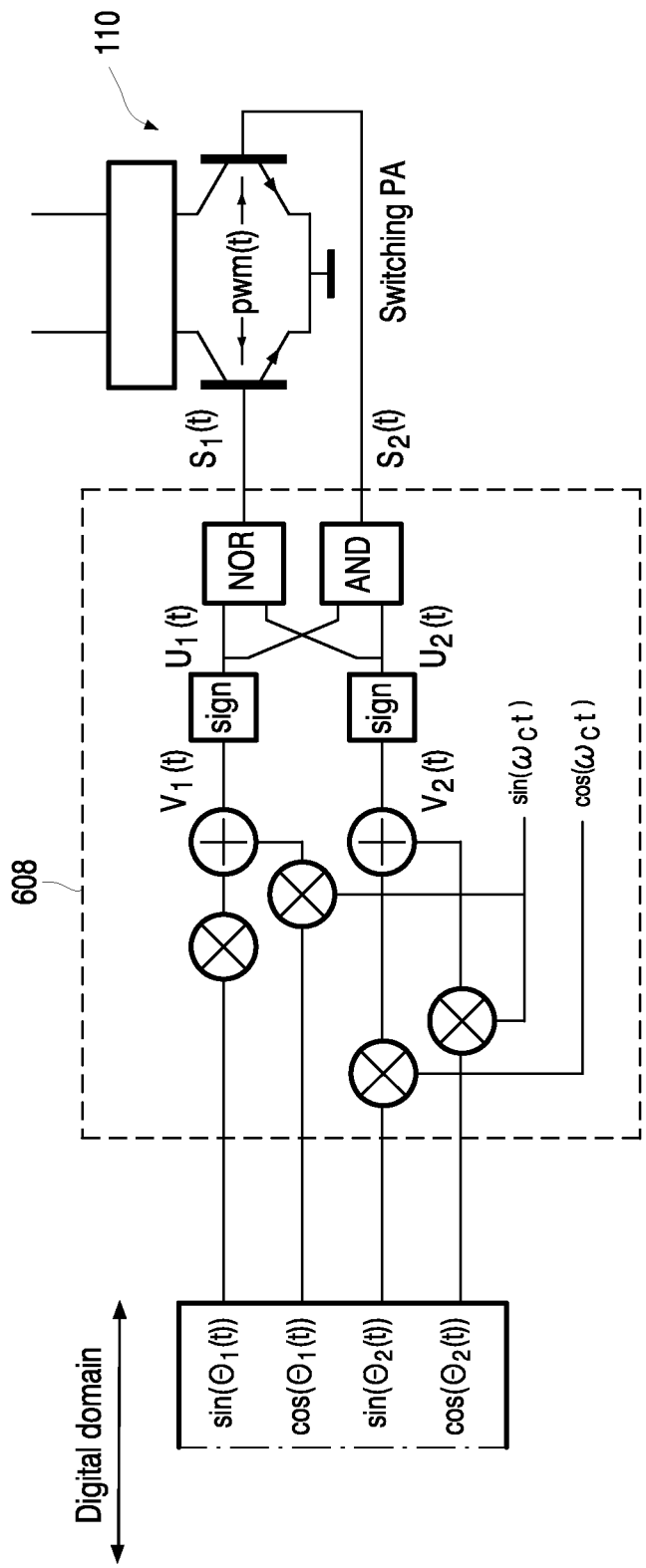
FIG. 6 an implementation of an PWM-PPM modulator according to the invention.

In FIG. 6 an implementation of a PWM-PPM modulator according to the invention is shown. The modulating unit 608 contains the first up converting unit 204 and the second up converting unit 212. Depicted are only the four functions provided by a mapping unit comprising the first mapping unit 202 and the second mapping unit 210:

$$\sin(\Theta_1(t)), \cos(\Theta_1(t)), \sin(\Theta_2(t)), \cos(\Theta_2(t)) \text{ wherein:}$$

$$\Theta_1(t)=\Phi_P(t)+\Phi_M(t) \text{ and } \Theta_2(t)=\Phi_P(t)-\Phi_M(t).$$

These four trigonometric functions can be created within a digital domain whereas further processing can be performed in an analogue domain. The four trigonometric functions are fed to the modulating unit 608. According to the present embodiment the modulating unit 608 comprises four multiplying units and two addition units. At the two outputs of the modulating unit 608 the signals $$v_1(t)=\sin(\omega_c t+\Phi_P(t)+\Phi_M(t)) \text{ and } v_2(t)=\sin(\omega_c t+\Phi_P(t)-\Phi_M(t))$$

are obtained.

Following the signal path two signum units are arranged yielding the opposite phase shifted signals $$u_1(t)=\text{sign}(\sin(\omega_c t+\Phi_P(t)+\Phi_M(t))) \text{ and } u_2(t)=\text{sign}(\sin(\omega_c t+\Phi_P(t)-\Phi_M(t))).$$

The signals $u_1(t)$ and $u_2(t)$ are then crosswise fed to a NOR and an AND gate yielding the signals $s_1(t)$ and $s_2(t)$:

$$s_1(t)=u_1(t)\overline{\cup}u_2(t) \text{ and } s_2(t)=u_1(t)\cap u_2(t).$$

These signals are then fed to the amplifier unit 110, e.g. a switching power amplifier, as shown in FIG. 6. In general, $s_1(t)$ and $s_2(t)$ can be used as a phase modulated signal which is useful for non-balanced power amplifier configurations.

Different implementations comprising other calculating and logical units are possible. For lucidity reasons the needed at least one carrier signal generator, for instance a voltage control oscillator (VCO), is also not shown in FIG. 6. Illustrated are only two input signals $\sin(\omega_c t)$ and $\cos(\omega_c t)$ corresponding to the carrier frequency $\omega_C$.

Figure 7:
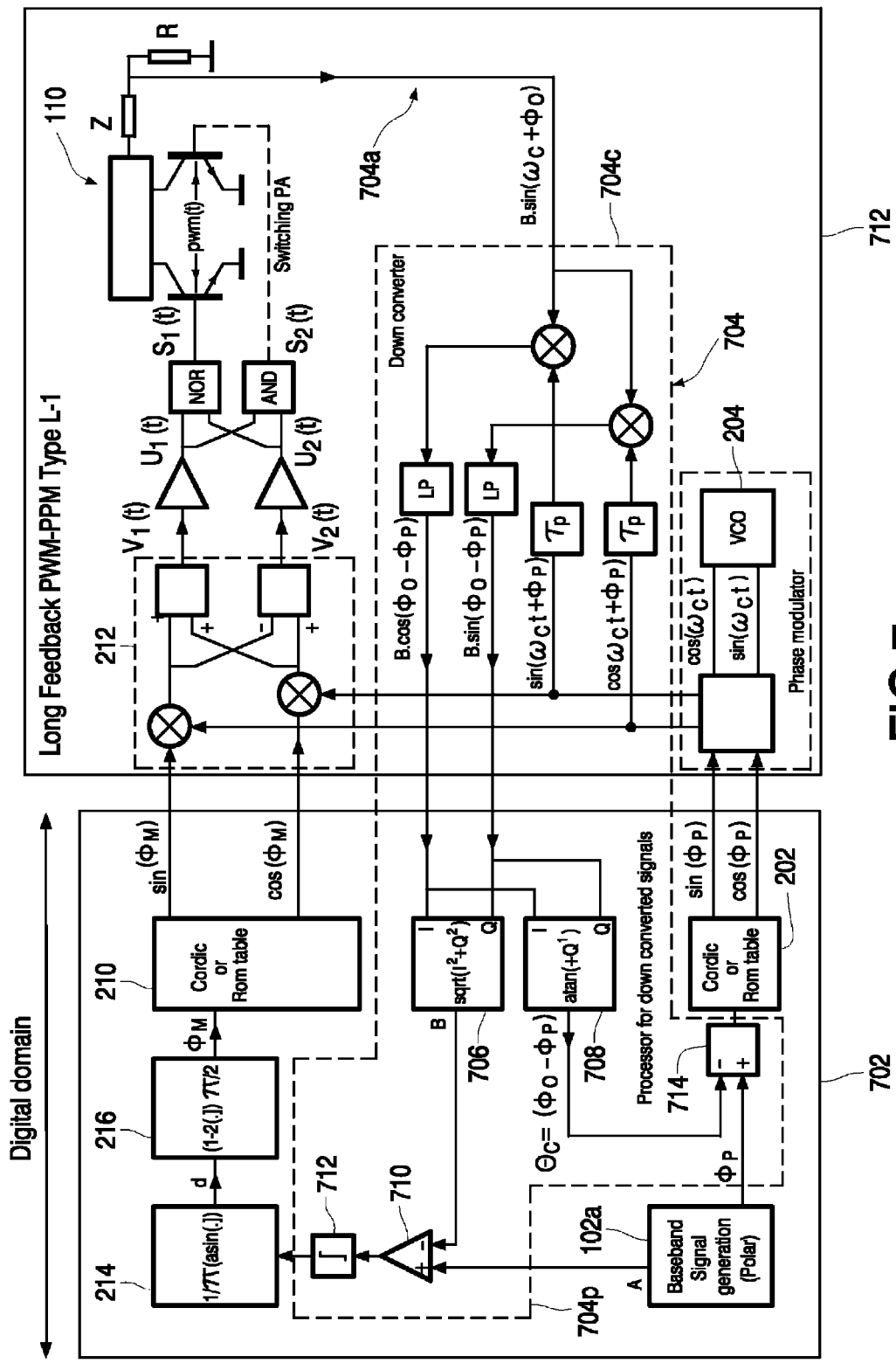
FIG. 7 a third embodiment of the apparatus according to the application.

FIG. 7 shows a third embodiment of the apparatus comprising a feedback loop path 704a according to the present invention. The shown apparatus comprises already known units holding the same reference signs, like determining units 214, 216, mapping units 202, 210, up converting units 204, 212, and the like.

The present apparatus can be divided into a digital domain 702 and an analogue domain 712. Other ways for dividing the apparatus into two different domains are possible.

According to the invention the apparatus encompasses a converting and processing unit 704 (dashed line) which is connected to the output of the amplifying unit 110. The shown converting and processing unit 704 comprises a converting subunit 704c and a processing subunit 704p, wherein the converting subunit 704c is implemented in the analogue domain 712 and the processing subunit 704p is implemented in the digital domain 702. The converting part 704c includes two multipliers, two low pass filtering units LP and two delay elements $\tau_p$. Another realization is possible.

The processing subunit 704p in the digital domain 702 may be implemented as a digital signal processor (DSP). The processing subunit 704p is supplied by the signals created by the converting subunit 704c of the converting and processing unit 704. In turn, the processing unit 704p presently includes an envelope detecting unit 706 and a phase detecting unit 708. The processing subunit 704p further comprises a first comparing unit 710 for comparing the detected amplitude component of the down converted signal with the amplitude component generated by the signal generator. It further comprises a first integrator unit 712 for correcting the amplitude component depending on the compared amplitude signal. Finally, the processing subunit 704p comprises an addition unit 704, which invertedly adds an error phase e supplied by the phase detecting unit 708 to the phase component of the generated signal.

The operation of the apparatus shown in FIG. 7 is elucidated in the following:

At the output of the amplifying unit 110, the signal being transmitted may be measured and forwarded to the converting and processing unit 704. The signal $s_t(t)$ being transmitted may be given by the equation $s_t(t) = B \sin(\omega_c t + \Phi_o)$, whereby $\Phi_o$ is the output phase and B is the amplitude component.

Within the converting subunit 704c of the converting and processing unit 704 signal $s_t(t)$ may be fed to a RF multiplier for multiplying with signal $\cos(\omega_c t + \Phi_P)$ delayed by factor $\tau_p$. On the other hand signal $s_t(t)$ may be fed to a RF multiplier for multiplying with signal $\sin(\omega_c t + \Phi_P)$ delayed by factor $\tau_p$ as well.

Signals $\sin(\omega_c t + \Phi_P)$ and $\cos(\omega_c t + \Phi_P)$ may be created by the separate first up converting unit 204. The delay elements $\tau_p$ are arranged to correct the delay difference between the desired and measured output phase. It may be possible to make a distinction between the desired and actual phase modulation.

As a result of the multiplication a complex base band signal can be obtained at the output of the low pass filters LP comprising an inphase component $I(t) = B \cos(\Phi_o - \Phi_P)$ and a quadrature component $Q(t) = B \sin(\Phi_o - \Phi_P)$.

Within the processing unit 704p of the converting and processing unit 704 the actual amplitude B can be calculated by the envelope detecting unit 706 using the inphase I(t) and quadrature component Q(t). The amplitude B is given by $B = \sqrt{I(t)^2 + Q(t)^2}$.

The actual error phase $\Phi_e$ can be calculated by the phase detecting unit 708 and is given by $$\Phi_e = (\Phi_o - \Phi_p) = \arctan\left(\frac{Q(t)}{I(t)}\right).$$

The obtained error signal $\Phi_e$ can be subtracted from the generated phase component $\Phi_p$ in the addition unit 714 to achieve a corrected phase component $\Phi_p$. In addition, the amplitude component A may be corrected by comparing it with the determined amplitude component B (comparing unit 710) and integrating the resulting signal (integrator 712). Further processing of the corrected amplitude and phase component is explained above. The corrected phases M and P are used as input signals for a the Cordic or Look-Up Tables (LUT) 202, 210 to generate the 4 desired digital output signals, which are successively converted to the analog domain preferably with the help of 4 DACs (not shown). The linearity of the signals $u_1(t)$ and $u_2(t)$ can thus be dramatically improved.

For clarity reasons possibly necessary components, like delay elements, analog digital converters, digital analog converters or the like are omitted. However, a person skilled in the art is able to implement such components if needed.

Figure 8:
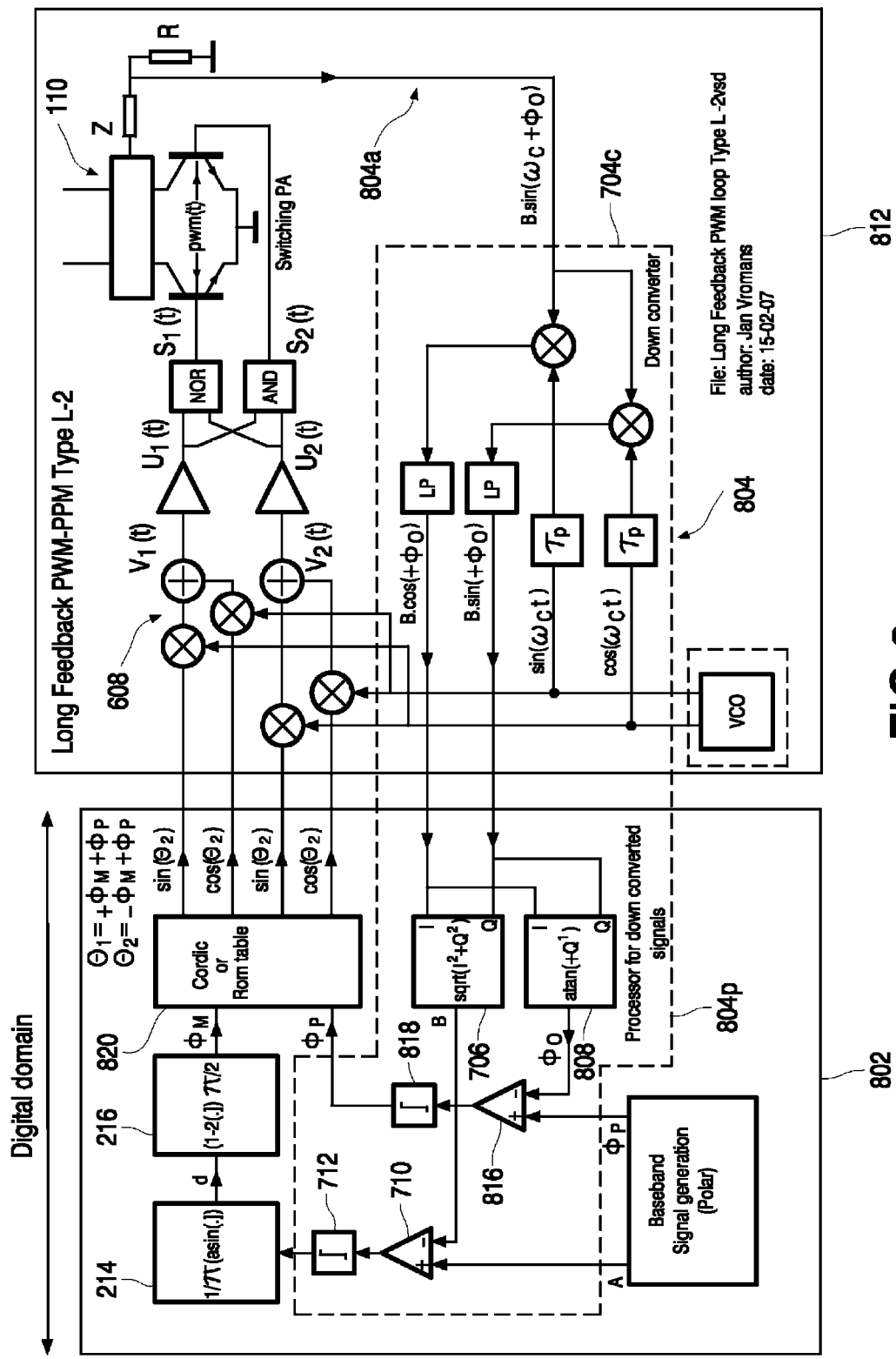
FIG. 8 a fourth embodiment of the apparatus according to the invention.

FIG. 8 shows a fourth embodiment of the apparatus according to the present invention. The apparatus depicted in FIG. 8 differs from the apparatus in FIG. 7 merely in some details which are described in the following.

The present apparatus encompasses a PWM-PPM modulating unit 608. Furthermore, a mapping unit 820 for the PWM-PPM modulating unit 608 for mapping at least the pulse shift function $\Phi_M$ and the phase component $\Phi_p$ to suitable functions is arranged. What is more, the processing subunit 804p of the converting and processing unit 804 comprises a second comparing unit 816 and a second integrator 818.

Due to the employed PWM-PPM modulation unit the signals $\sin(\omega_c t)$ and $\cos(\omega_c t)$ supplied by the VCO shown FIG. 8 are delayed and fed to the multipliers arranged within the converting subunit 704c of the converting and processing unit 804. After multiplying and low pass filtering the complex base band signal can be obtained at the output of the converting subunit 704c comprising the inphase component $I(t) = B \cos(\Phi_o)$ and the quadrature component $Q(t) = B \sin(\Phi_o)$.

The output phase $\Phi_o$ calculated by the phase detecting unit 808 is fed to the arranged second comparing unit 816 and the compared signal may be integrated by the additional second integrator 818. The remaining processing steps are already known and they are not explained again.

By means of the apparatus shown in FIG. 8 the linearity of the signals $u_1(t)$ and $u_2(t)$ being amplified can again be dramatically improved.

The invention claimed is:

1. An apparatus comprising:
   a signal generator (102, 102a) configured to generate a polar signal,
   a pulse width modulating unit (108) configured to modulate the polar signal,
   an amplifier unit (110) configured to amplify the modulated signal,
   a feedback loop path (104a, 504a, 704a, 804a) configured to correct the modulated signal using an error signal,
   wherein the feedback loop path comprises a converting and processing unit (104 504, 704, 804) configured for down converting the amplified signal and correcting the generated signal using the error signal.

2. The apparatus according to claim 1, wherein the apparatus comprises a predistortion unit (106) configured to predistort the generated signal.

3. The apparatus according to claim 2, wherein the predistortion unit (106) is configured to determine a phase shift function depending on the generated signal.

4. The apparatus according to claim 2, wherein the predistortion unit (106) comprises a first determining unit (214) configured to determine a duty cycle function depending on the generated signal.

5. The apparatus according to claim 4, wherein the predistortion unit (106) comprises a second determining unit (216) configured to determine a phase shift function depending on the determined duty cycle function.

6. The apparatus according to claim 1, further comprising a pulse position modulating unit (208) configured to process a phase component of the generated signal.

7. The apparatus according to claim 6, wherein the pulse position modulating unit (208) comprises a first mapping unit (202) configured to map the phase component to at least one suitable function according to a chosen implementation of the pulse position modulating unit (208).

8. The apparatus according to claim 6, wherein the pulse position modulating unit (208) comprises a first up converting unit (204).

9. The apparatus according to claim 3, wherein the pulse width modulating unit (108) comprises a second mapping unit (210) configured to map the phase shift function to at least one suitable function according to a chosen implementation of the pulse width modulating unit (108).

10. The apparatus according to claim 1, wherein the pulse width-modulating unit (108) comprises a second up converting unit (212).

11. The apparatus according to claim 6, wherein the pulse width modulating unit (108) and the pulse position modulating unit (208) are arranged as one pulse width pulse position modulating unit (608).

12. The apparatus according to claim 1, wherein the converting and processing unit (704, 804) comprises a converting subunit (704c) a processing subunit (704p, 804p).

13. The apparatus according to claim 12, wherein the converting subunit (704c, 804c) of the converting and processing unit (704, 804) comprises at least one multiplier and/or at least one low pass filter and/or at least one delay element.

14. The apparatus according to claim 12, wherein the processing subunit (704p, 804p) of the converting and processing unit (704, 804) comprises at least one of: an envelope detecting unit (706), (B) a phase detecting unit (708, 808).

15. The apparatus according to claim 12, wherein the processing subunit (704p, 804p) of the converting and processing unit (704, 804) comprises at least one of:
   a first comparing unit (710) and a first integrator (712) for correcting an amplitude component,
   a second comparing unit (816) and a second integrator (818) for correcting a phase component.

16. The apparatus according to claim 12, wherein the converting subunit (704c, 804c) is implemented in the analogue domain (712, 812) and the processing subunit (704p, 804p) is implemented in the digital domain (702, 802).

17. A transmitter comprising an apparatus according to claim 1.

18. A method comprising:
   generating a polar signal,
   modulating the polar signal using pulse width modulation,
   amplifying the modulated signal,
   down converting the amplified signal, and
   generating an error signal to correct the generated signal.

19. The method of claim 18, further comprising processing a phase component of the generated signal, wherein processing the phase component includes mapping the phase component to at least one suitable function according to a chosen implementation of pulse width modulation.

* * * * *